US012666549B2

(12) United States Patent
Lin et al.

(10) Patent No.: US 12,666,549 B2
(45) Date of Patent: Jun. 23, 2026

(54) ELECTRONIC APPARATUS

(71) Applicants: Tyco Electronics (Shanghai) Co., Ltd., Shanghai (CN); Tyco Electronics AMP Qingdao Ltd., Qingdao City (CN)

(72) Inventors: Guibin (Gabby) Lin, Foshan (CN); Zhiqiang (Simon) Li, Shanghai (CN); Jiefeng (Lear) Zhang, Shanghai (CN); Jinqiang (Jeff) Wang, Qingdao (CN); Wei (David) Zhao, Shanghai (CN); Tingting Zhang, Shanghai (CN); Guoxiao (Neo) Shen, Shanghai (CN)

(73) Assignees: Tyco Electronics (Shanghai) Co., Ltd., Shanghai (CN); Tyco Electronics AMP Qingdao Ltd., Qingdao City (CN)

(*) Notice: Subject to any disclaimer, the term of this patent is extended or adjusted under 35 U.S.C. 154(b) by 115 days.

(21) Appl. No.: 18/816,586

(22) Filed: Aug. 27, 2024

(65) Prior Publication Data

US 2025/0081362 A1     Mar. 6, 2025

(30) Foreign Application Priority Data

Sep. 1, 2023   (CN) .......................... 202311126027.0
Jun. 21, 2024   (CN) .......................... 202410816900.7

(51) Int. Cl.
*H05K 5/00* (2025.01)
*H01R 12/71* (2011.01)
(Continued)

(52) U.S. Cl.
CPC ........... *H05K 5/006* (2013.01); *H01R 12/714* (2013.01); *H01R 13/508* (2013.01); *H05K 5/0217* (2013.01); *H05K 5/0247* (2013.01)

(58) Field of Classification Search
None
See application file for complete search history.

(56) References Cited

U.S. PATENT DOCUMENTS 7,729,121 B1 * 6/2010 Deshpande ......... H01L 23/3677
                                                      257/727
8,545,258 B1 * 10/2013 Grice .................. H01L 23/4006
                                                      439/487
(Continued)

FOREIGN PATENT DOCUMENTS

CN          1802747 B  *  7/2010   ......... H01L 23/4006

*Primary Examiner* — James Wu
*Assistant Examiner* — Christopher L Augustin
(74) *Attorney, Agent, or Firm* — Barley Snyder

(57) ABSTRACT

An electronic apparatus includes a main circuit board, an electronic device, side circuit boards, and a pressure applying unit. The electronic device is installed on and electrically connected to the main circuit board. The side circuit boards are positioned at edges of the electronic device on a side of the electronic device away from the main circuit board and electrically connected to the electronic device. The pressure applying unit is positioned on a side of the electronic device and on each of the side circuit boards away from the main circuit board. The pressure applying unit applies pressure: 1) to the side circuit boards to maintain an electrical connection between the side circuit boards and the electronic device; and 2) to side regions of the electronic device to maintain an electrical connection between the main circuit board and the electronic device.

20 Claims, 14 Drawing Sheets

(51) Int. Cl.
 H01R 13/508 (2006.01)
 H05K 5/02 (2006.01)

(56) References Cited

U.S. PATENT DOCUMENTS

2008/0009152 A1* 1/2008 Colbert ............... H01L 23/4006
 257/E23.084
2012/0092826 A1* 4/2012 Heidepriem ........ H01L 23/4006
 361/679.54
2013/0321241 A1* 12/2013 Lin ...................... H01Q 1/2275
 343/906
2022/0174836 A1* 6/2022 Wang ................... H05K 7/1417
2025/0098122 A1* 3/2025 Cui ...................... H05K 7/2049

* cited by examiner

ELECTRONIC APPARATUS

CROSS-REFERENCE TO RELATED APPLICATION

This application claims the priority of Chinese Patent Application No. 202311126027.0 filed on Sep. 1, 2023 and entitled "Electronic Apparatus", and the priority of Chinese Patent Application No. 202410816900.7 filed on Jun. 21, 2024 and entitled "Electronic Apparatus", the whole disclosures of which are incorporated herein by reference.

FIELD OF THE DISCLOSURE

The present disclosure relates to an electronic apparatus, and in particular, to an electronic apparatus including an electronic device and circuit boards.

BACKGROUND

In an electronic apparatus of the prior art, electronic devices (such as a central processing unit or CPU) installed on a main circuit board may further be electrically connected to other circuit boards on a side of the electronic devices opposite to the main circuit board. These electronic devices are generally large, requiring the removal of top covers thereof in order to improve heat dissipation. This results in poor overall rigidity of the electronic devices and easy deformation under stress. As a result, conductive pins positioned in different positions of the electronic devices may not be in stable contact with the circuit boards to establish a stable electrical connection. Therefore, it is necessary to apply pressure to the electronic devices and/or one or more circuit boards to establish the stable electrical connection between them.

The circuit boards positioned on a top surface of the electronic device are usually located at edges of a periphery of the electronic device. The pressure applied by conventional pressure applying apparatus will tilt the circuit boards or even the electronic device resulting in smaller effective contact area between the circuit boards and the electronic device. Further, some pins of the electronic device cannot make in contact with the circuit board to establish an electrical connection.

SUMMARY

According to an embodiment of the present disclosure, an electronic apparatus includes a main circuit board, an electronic device, side circuit boards, and a pressure applying unit. The electronic device is installed on and electrically connected to the main circuit board. The side circuit boards are positioned at edges of the electronic device on a side of the electronic device away from the main circuit board and electrically connected to the electronic device. The pressure applying unit is positioned on a side of the electronic device and on each of the side circuit boards away from the main circuit board. The pressure applying unit applies pressure: 1) to the side circuit boards to maintain an electrical connection between the side circuit boards and the electronic device; and 2) to side regions of the electronic device to maintain an electrical connection between the main circuit board and the electronic device.

BRIEF DESCRIPTION OF THE DRAWINGS

The accompanying drawings incorporated therein and forming a part of the specification illustrate the present disclosure and, and together with the description, further serve to explain the principles of the disclosure and to enable those skilled in the relevant art to manufacture and use the embodiments described herein.

Figure 1:
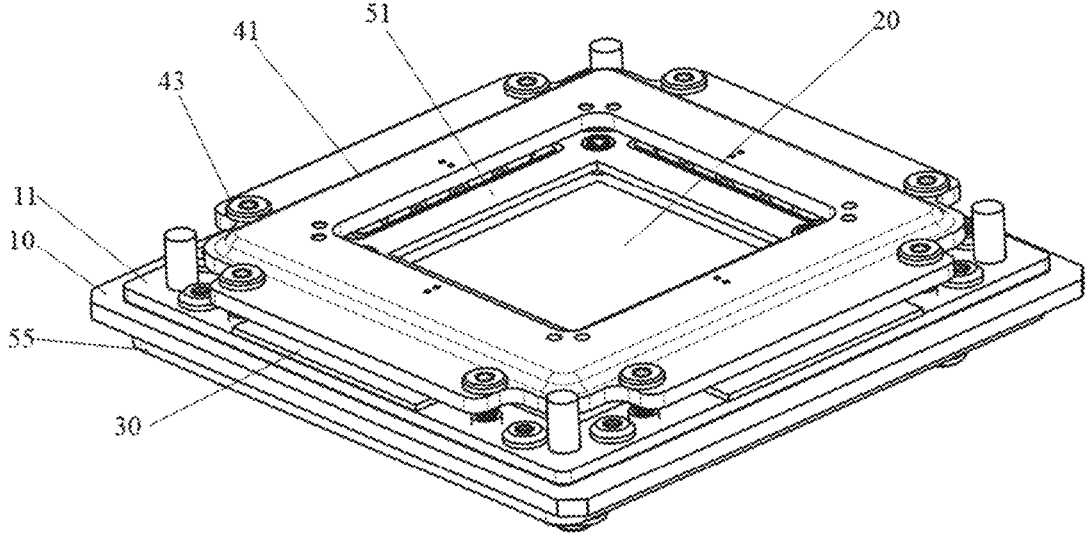
FIG. 1 shows a perspective view of an electronic apparatus according to one embodiment of the present disclosure.

The features disclosed in this disclosure will become more apparent in the following detailed description in conjunction with the accompanying drawings, where similar reference numerals always identify the corresponding components. In the accompanying drawings, similar reference numerals typically represent identical, functionally similar, and/or structurally similar components. Unless otherwise stated, the drawings provided throughout the entire disclosure should not be construed as drawings drawn to scale.

DETAILED DESCRIPTION OF THE EMBODIMENTS

Hereinafter, embodiments of the present disclosure will be described with reference to the accompanying drawings. The same reference numerals and symbols shown in the drawings of the present disclosure refer to elements or components performing substantially the same function.

Furthermore, the terminology used herein is intended to describe the embodiments, and is not intended to limit and/or constrain the present disclosure. The singular forms "a", "an", "the" and "said" are intended to include the plural forms as well, unless the context clearly dictates otherwise. In the present disclosure, the terms such as "include", "comprise", "have" and the like, are intended to specify the presence of stated features, number, steps, operations, elements, components and combinations thereof, but do not preclude the presence or addition of one or more other features, number, steps, operations, elements, components and combinations thereof.

Although the terms such as "first", "second", "third" and the like are used herein to describe various elements, these elements should not be limited by these terms. These terms are only intended to distinguish one element from another. For example, a first element would be termed a second element, and a second element would be termed a first element, without departing from the scope of the present disclosure. The term "and/or" includes a plurality of combinations of the associated items or any one of a plurality of associated items.

An embodiment of the present disclosure provides an electronic apparatus. The electronic apparatus includes a main circuit board 10, an electronic device 20 installed on and electrically connected to the main circuit board, and side circuit boards 30 positioned at edges of the electronic device on a side of the electronic device away from the main circuit board and electrically connected to the electronic device. The electronic apparatus further includes a pressure applying unit 40 positioned on a side of the electronic device 20 and each of the side circuit boards 30 away from the main circuit board 10. The pressure applying unit 40 is adapted to apply pressure to the side circuit boards 30 to maintain an electrical connection between the side circuit boards 30 and the electronic device 20, and the pressure applying unit is further adapted to apply pressure to side regions 22 of the electronic device 20 to maintain an electrical connection between the main circuit board 10 and the electronic device 20.

In some embodiments, the electronic apparatus may further include a central pressure applying unit 50 adapted to apply pressure to a central region 21 and corner regions 23 of the electronic device 20 to maintain the electrical connection between the main circuit board 10 and the electronic device 20.

In various embodiments of the present application, the electronic device 20 may be a central processing unit (CPU) with or without a top cover, and the electronic device may have a relatively large size. The side circuit boards 30 may be positioned at edges surrounding a central chip of the electronic device such as CPU.

Figure 2:
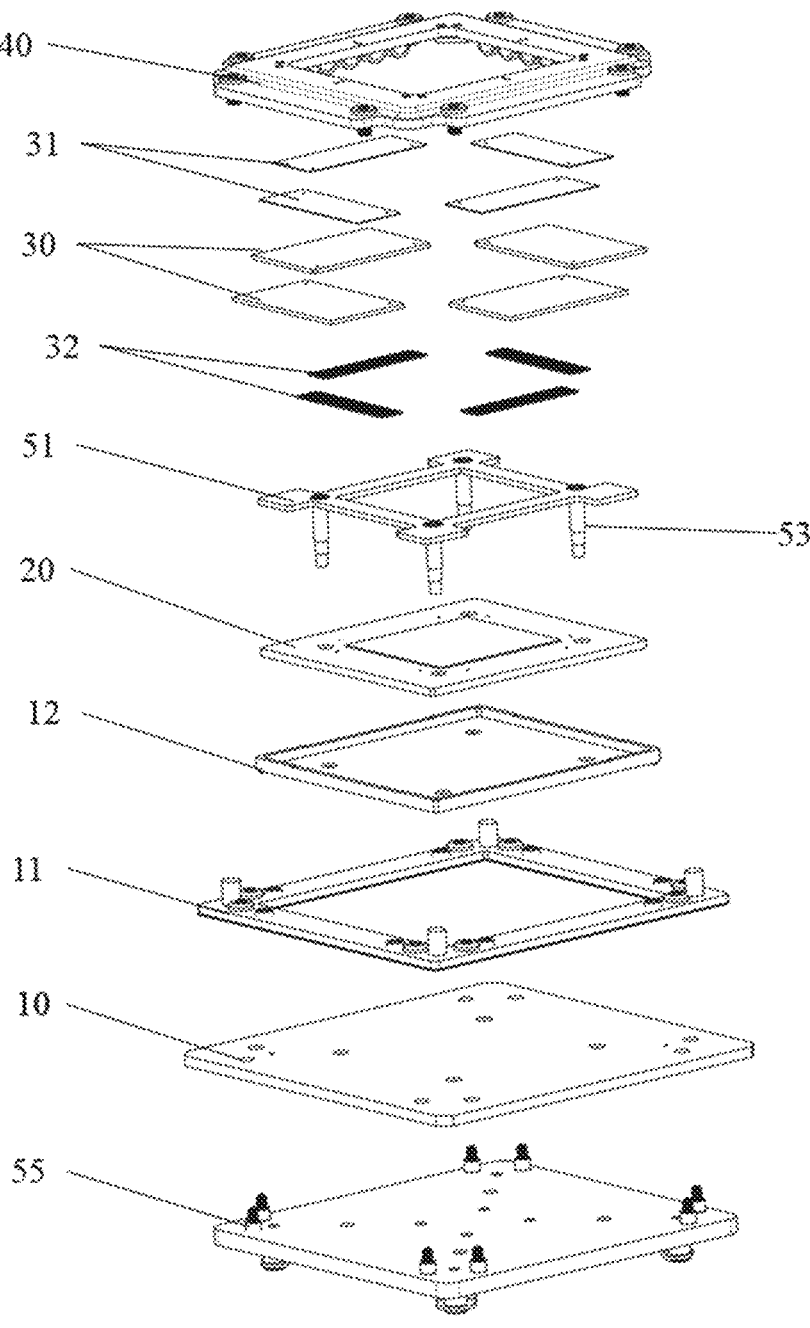
FIG. 2 shows an exploded view of the electronic apparatus according to one embodiment of the present disclosure.
Figure 3:
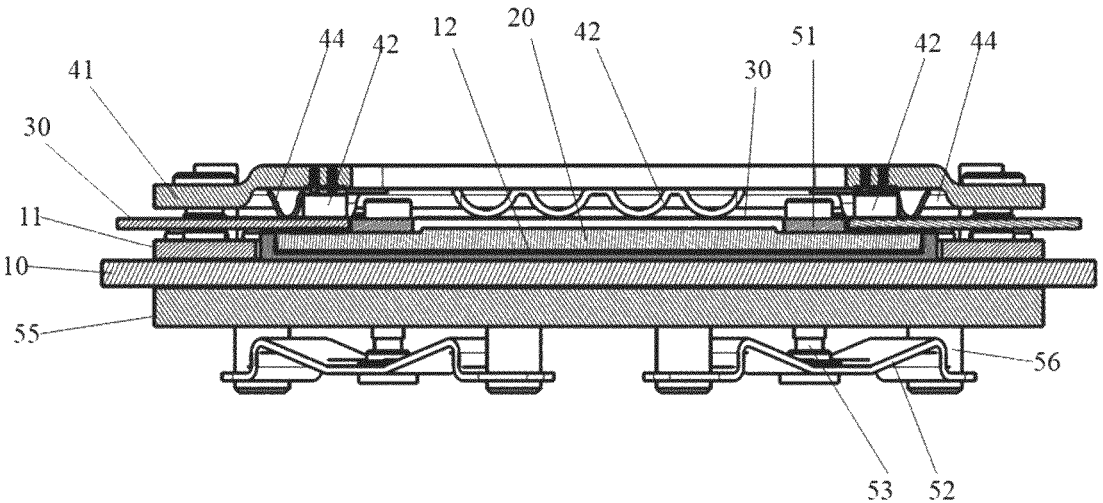
FIG. 3 shows a cross-sectional view of the electronic apparatus according to one embodiment of the present disclosure.
Figure 4:
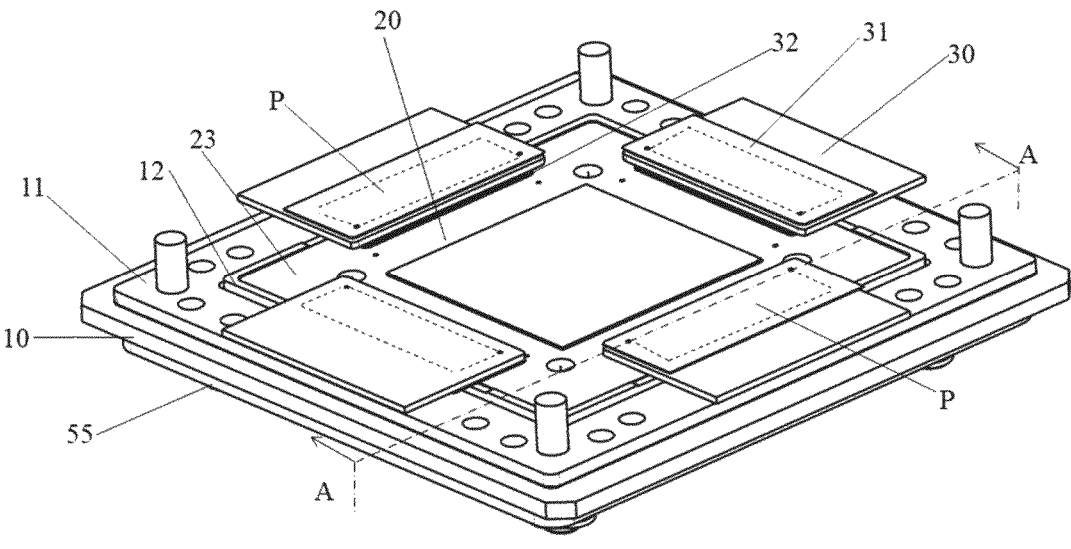
FIG. 4 shows a perspective view of the electronic apparatus with a pressure applying unit and a central pressure applying unit removed, according to one embodiment of the present disclosure.

As shown in FIGS. 2-4, in the electronic apparatuses provided by the present application, each of the electronic apparatus includes not only the main circuit board 10 and the electronic device 20 installed on and electrically connected to the main circuit board, but also a plurality of side circuit boards 30 electrically connected to the electronic device 20. As better shown in FIG. 4, the side circuit boards 30 are positioned on a side of the electronic device 20 away from the main circuit board 10, i.e., on a top surface of the electronic device 20, and are positioned at edge portions of the electronic device 20. In other words, both at least a portion of a bottom surface and at least a portion of the top surface of the electronic device 20 have pins adapted to be electrically connected with the corresponding circuit board, wherein the pins on the bottom surface of the electronic device 20 are adapted to be electrically connected to the main circuit board 10, and the pins on the top surface of the electronic device 20 are adapted to be electrically connected to the side circuit boards 30. That is to say, at least a portion of the electronic device 20 is sandwiched between the main circuit board 10 and the side circuit boards 30. In the illustrated embodiments, the side circuit boards 30 are positioned at four edge portions of the top surface of the electronic device 20, so that the chip positioned at a central portion of the electronic device is exposed to facilitate heat dissipation of the electronic device.

In order to establish the stable electrical connections between the side circuit boards 30 and the electronic device 20 and between the main circuit board 10 and the electronic device 20, the electronic apparatus provided by the present application further includes the pressure applying unit 40, which is positioned on a side of the electronic device 20 and each of the side circuit boards 30 away from the main circuit board 10, i.e., positioned above the top surface of the electronic device 20 and the top surface of each of the side circuit boards 30. The pressure applying unit is adapted to apply pressure to the side circuit boards 30 to maintain the electrical connection between the side circuit boards and the electronic device 20. In addition, the pressure applied by the pressure applying unit 40 to the side circuit boards 30 is further adapted to be transmitted to the side regions 22 of the electronic device 20 via the side circuit boards 30, thereby maintaining the electrical connection between the main circuit board 10 and the electronic device 20.

Figure 6:
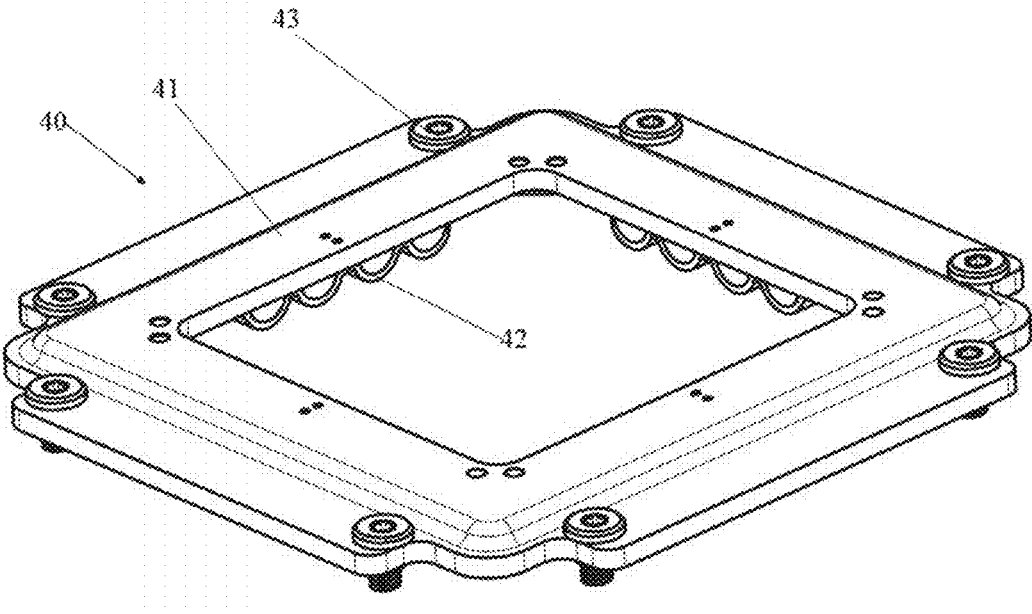
FIG. 6 shows a top perspective view of the pressure applying unit of the electronic apparatus according to one embodiment of the present disclosure.
Figure 7:
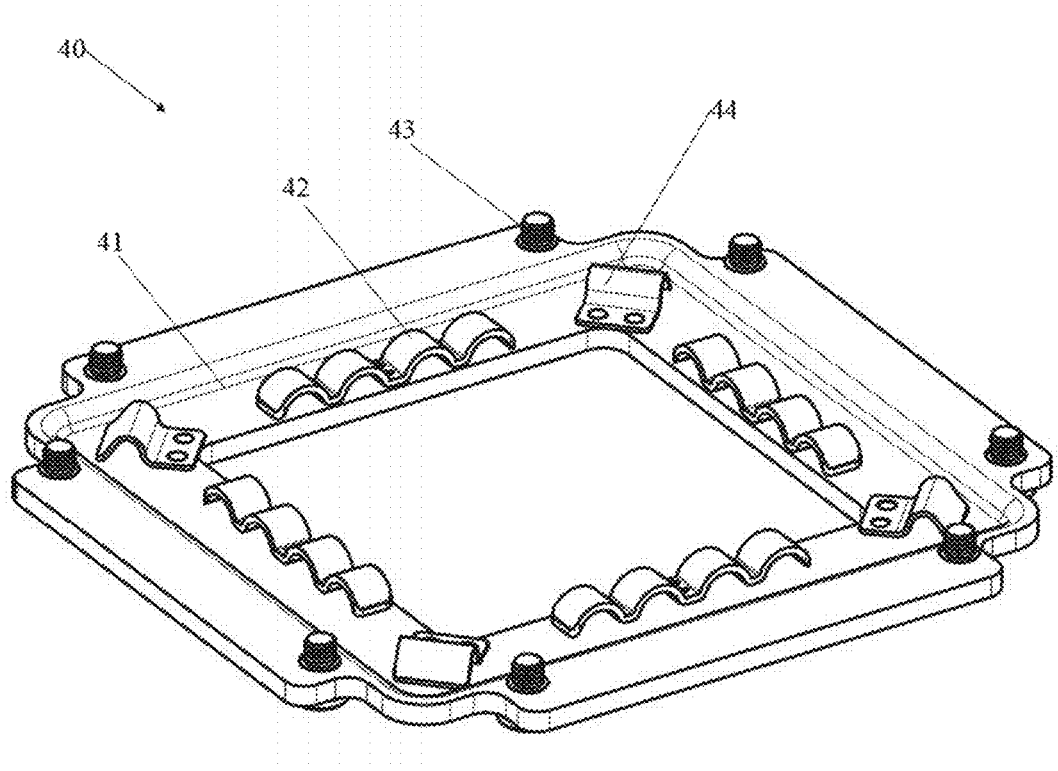
FIG. 7 shows a perspective bottom view of the pressure applying unit of the electronic apparatus according to one embodiment of the present disclosure.
Figure 8:
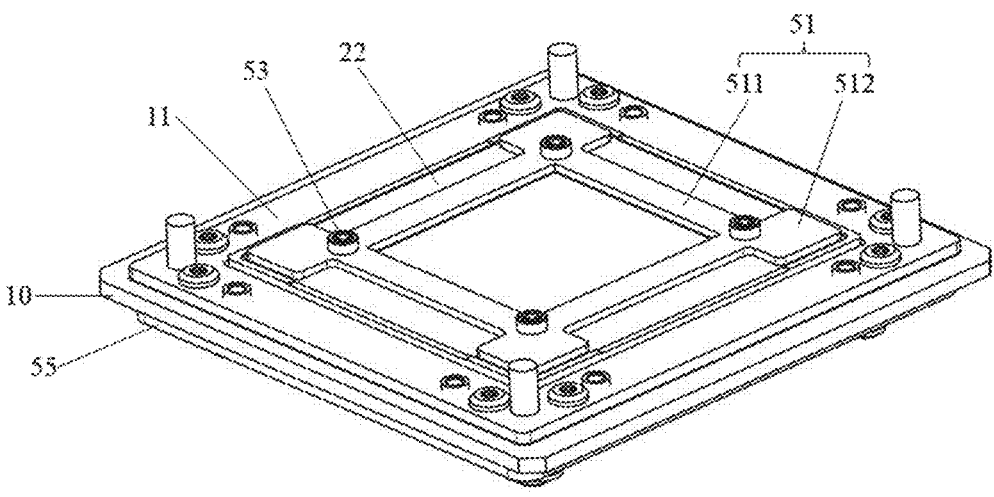
FIG. 8 shows a top perspective view of the electronic apparatus with the pressure applying unit and side circuit boards removed, according to one embodiment of the present disclosure.
Figure 9:
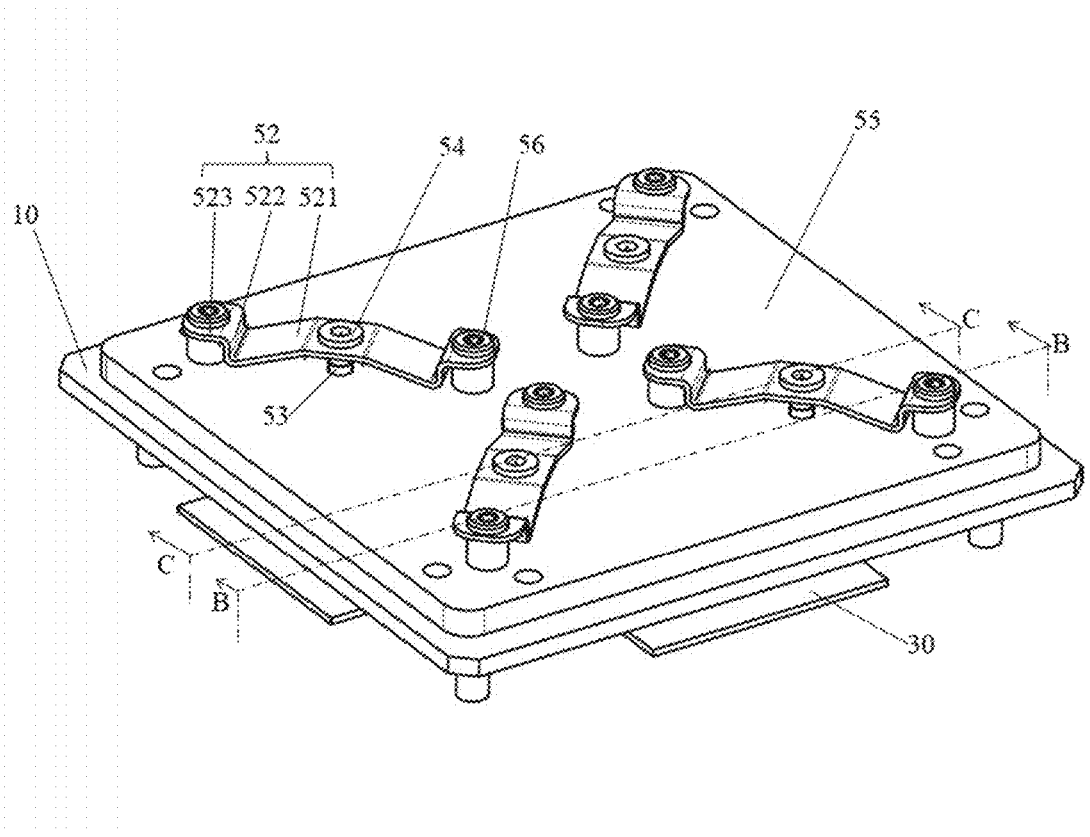
FIG. 9 shows a bottom perspective view of the electronic apparatus shown in FIG. 8.
Figure 10:
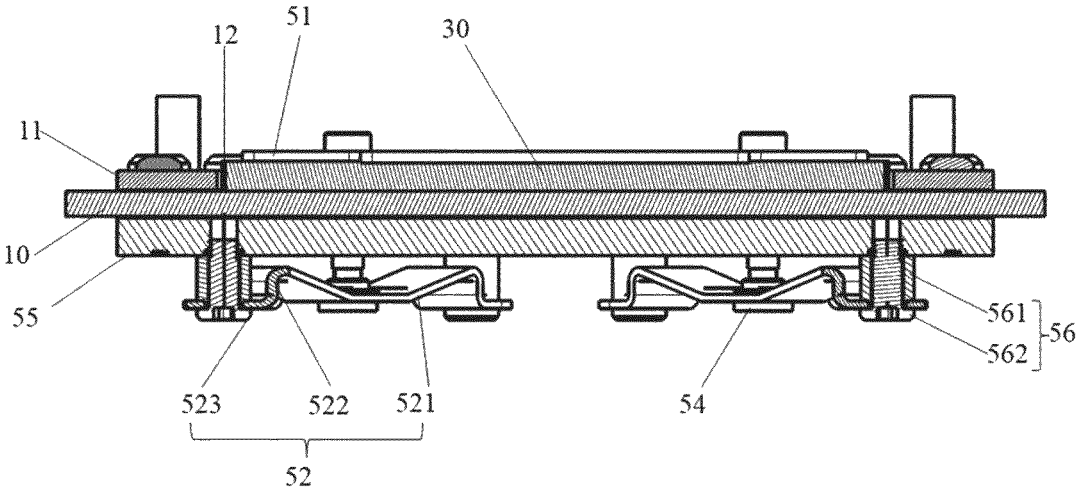
FIG. 10 shows a cross-sectional view of the electronic apparatus with the pressure applying unit and the side circuit boards removed, taken along line B-B in FIG. 9, according to one embodiment of the present disclosure.
Figure 11:
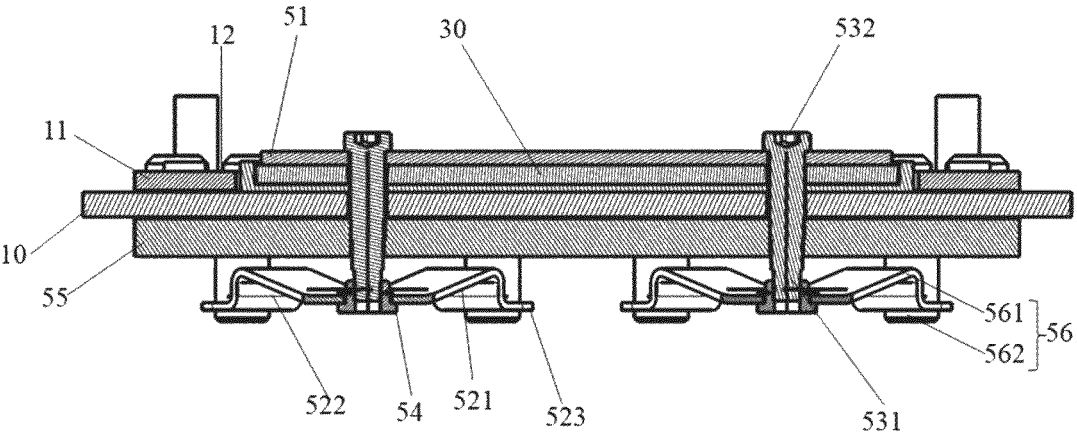
FIG. 11 shows a cross-sectional view of the electronic apparatus with the pressure applying unit and the side circuit boards removed, taken along line C-C in FIG. 9, according to one embodiment of the present disclosure.
Figure 12:
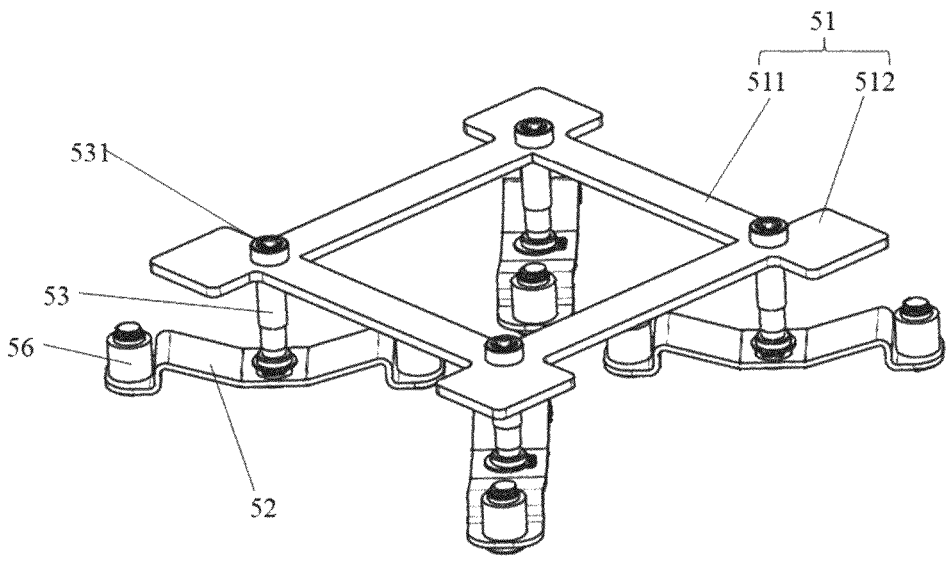
FIG. 12 shows a perspective view of the central pressure applying unit of the electronic apparatus according to one embodiment of the present disclosure.
Figure 13:
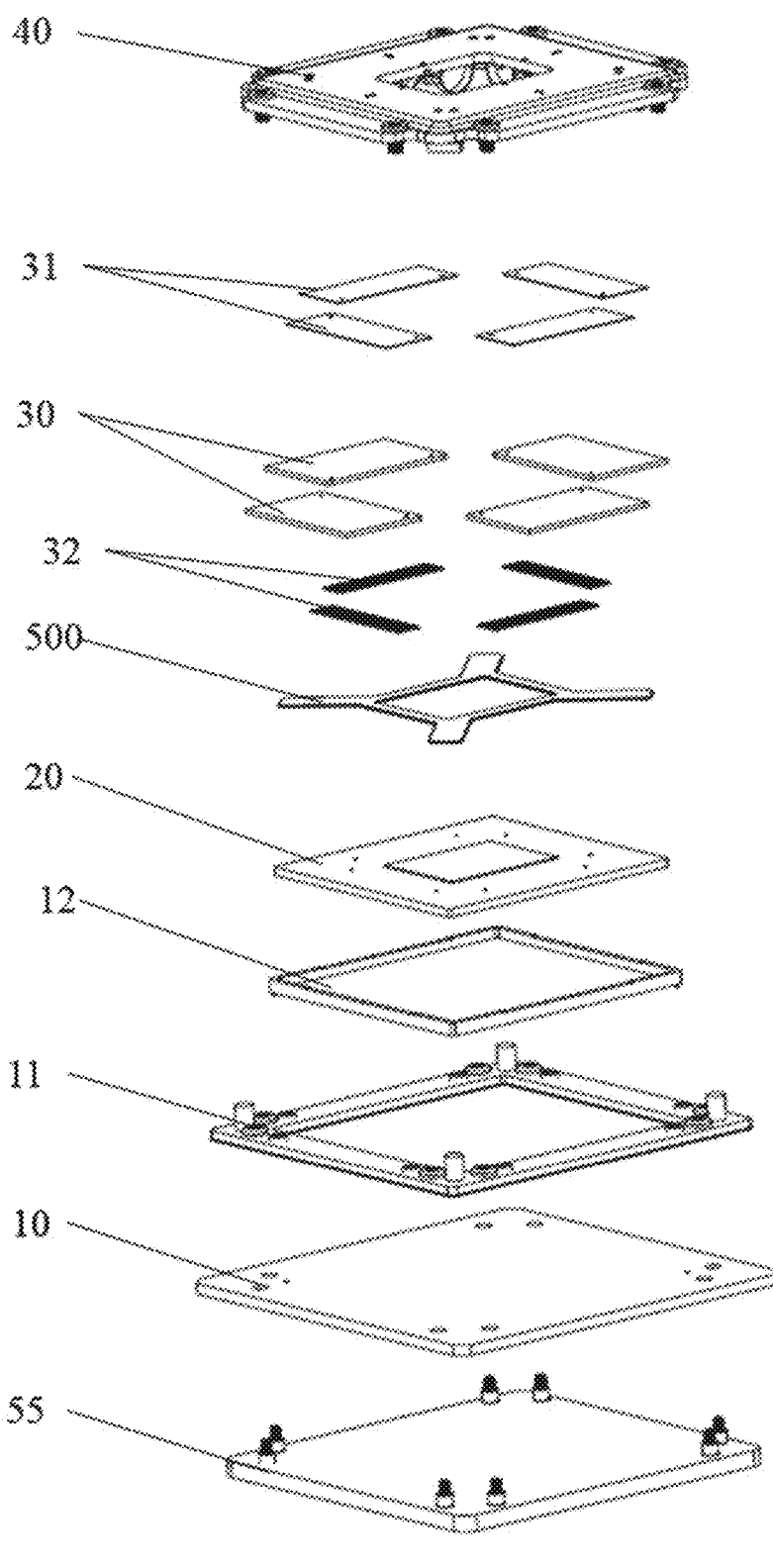
FIG. 13 shows an exploded view of an electronic apparatus according to another embodiment of the present disclosure.

As shown in FIGS. 6 and 7, the pressure applying unit 40 may include a top plate 41, and a plurality of first elastic pieces 42 which are positioned on a side surface of the top plate facing the side circuit boards 30 and adapted to apply pressure to the side circuit boards.

The top plate 41 may have a substantially quadrilateral shape, such as a rectangular shape or a square shape. An opening is provided in the center of the top plate for the heat dissipation of the electronic device 20, especially for the heat dissipation of the central region of the electronic device 20 containing the chip. The top plate 41 is adapted to be directly or indirectly connected to the main circuit board 10.

In the illustrated embodiments, the top plate 41 is indirectly connected to the main circuit board 10 via a fixing frame 11. As shown in FIGS. 1, 4 and 7, the fixing frame 11 is fixed to the same side of the main circuit board 10 as the electronic device 20. In the illustrated embodiments, the fixing frame 11 is detachably fixed to the main circuit board 10 by a screw. However, in some embodiments not shown, the fixing frame 11 may be fixed to the main circuit board 10 by means of adhesive or welding, etc. The fixing frame 11 surrounds the electronic device 20 to fix it in place, thereby preventing the electronic device 20 from displacing in a plane in which the top surface of the main circuit board 10 is located. In some embodiments, the fixing frame 11 may also encircle or surround a main socket connector 12, which will be further described below, thereby preventing the main socket connector 12 from displacing in the plane in which the top surface of the main circuit board 10 is located.

In the illustrated embodiments, the top plate 41 of the pressure applying unit 40 may be detachably coupled to the fixing frame 11 by a top plate screw 43, so that the top plate 41 is indirectly connected to the main circuit board 10 via the fixing frame 11. However, in some embodiments not shown, the top plate 41 of the pressure applying unit 40 may be directly connected to the main circuit board 10 by the top plate screw. In some other embodiments, the top plate 41 may be directly connected to the main circuit board 10 by adhesive, a rivet, or by means of welding.

The first elastic pieces 42 of the pressure applying unit 40 are positioned on the side surface of the top plate 41 facing the side circuit boards 30, that is, on a lower surface of the top plate 41. The first elastic piece 42 is adapted to apply pressure to the side circuit board 30. As described above, the pressure applied by the first elastic piece 42 is further adapted to act on the side regions 22 of the electronic device 20 via the side circuit board.

The first elastic piece 42 may be detachably fixed to each of four sides of the top plate 41 by a screw. In other embodiments, the first elastic piece 42 may be fixed to each of the four sides of the top plate 41 by means of welding or by a rivet. In some embodiments, the first elastic piece 42 may be bonded to the lower surface of the top plate 41 by adhesive.

In addition, as shown in FIGS. 6 and 7, the first elastic piece 42 is in a undulating or wavy form, and each first elastic piece has multiple protrusions facing the side circuit board 30, the protrusions being adapted to apply pressure to the side circuit board 30 by deformation. In addition, the first elastic piece 42 is fixed to the top plate 41 at its middle position, and two ends of the first elastic piece 42 in a length direction are free ends that are not fixed to the top plate. As a result, the first elastic piece may stretch and deform in the length direction. The first elastic piece 42 may be made of a highly elastic metal material, such as a highly elastic copper alloy, but the present disclosure is not limited to this.

In the illustrated embodiments, the top plate 41 is coupled to the fixing frame 11 by the top plate screw 43. Therefore, an elastic force of the first elastic piece 42 is adjusted by adjusting a depth at which the top plate screw 43 is screwed into the fixing frame 11, thereby in turn adjusting the pressure acting on the side circuit board 30 and the side region 22 of the electronic device 20. In this case, the force between the electronic device 20 and the main circuit board 10 as well as the side circuit board 30 is adjustable. Therefore, it can not only avoid that the pins for establishing the electrical connection cannot establish the stable electrical connection because of insufficient local force, but also prevent the circuit board or even the electronic device from tilting because of uneven force, thereby establishing the stable electrical connection between the circuit board and the electronic device.

Figure 5:
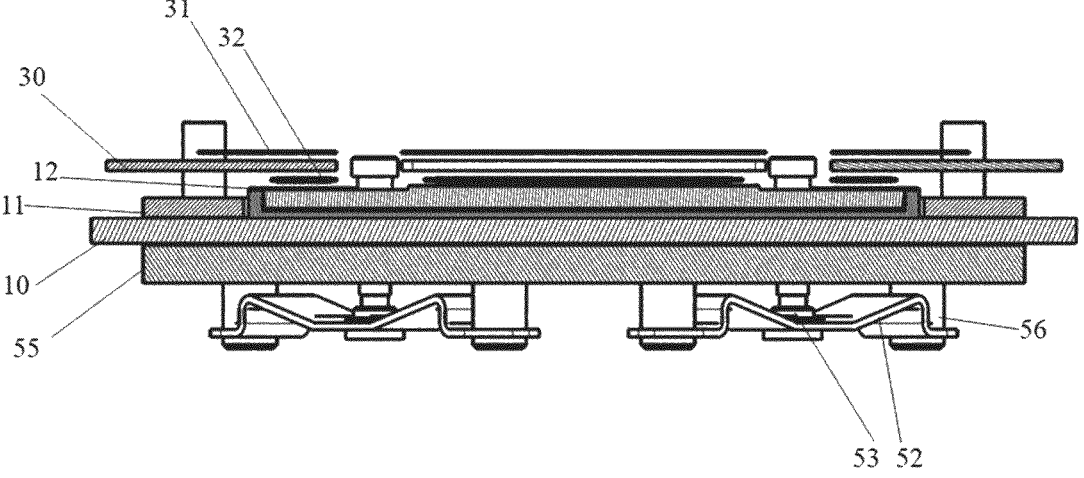
FIG. 5 shows a cross-sectional view taken along line A-A in FIG. 4.

As shown in FIGS. 4 and 5, the electronic apparatus further includes a first protection board or plate 31 positioned between the side circuit board 30 and the first elastic piece 42. That is to say, the first protection plate 31 is positioned to cover at least a portion of the side circuit board 30. The first protection plate 31 is made of a rigid material and may evenly dispense the pressure applied by the first elastic piece 42 onto the side circuit board 30, thereby protecting the side circuit board 30 from damage caused by concentrated pressure.

In this case, the elastic force generated by the compression of the first elastic piece 42 first acts on a pressed region P of the first protection plate 31 (as shown in FIG. 4), then is transmitted to the side circuit board 30 positioned below the first protection plate 31, then to a side socket connector 32, which is present in some embodiments described below, then to the side region 22 of the electronic device 20, and finally to the main circuit board 10.

In the illustrated embodiment, the first protection plate 31 may be made of a metal material such as stainless steel, aluminum or aluminum alloy, copper or copper alloy, and an insulation layer is provided on a side surface of the first protection plate facing the side circuit board 30. The insulation layer may be made of plastic and boned to a lower surface of the first protection plate 31. In some embodiments not shown, the first protection plate 31 may also be made of a rigid plastic material. Therefore, it is not necessary to provide the insulation layer on the side surface of the first protection plate or board facing the side circuit board.

As shown in FIGS. 3 and 7, the pressure applying unit 40 may further include a plurality of second elastic pieces 44 positioned on a side surface of the top plate 41 facing the electronic device 20 and positioned at the respective corner between two adjacent sides of the top plate. Therefore, the second elastic piece is adapted to apply pressure to the corner region 23 of the electronic device 20.

Similar to the first elastic piece 42, the second elastic piece 44 may be detachably fixed to each of four corners of the top plate 41 by a screw. Alternatively, the second elastic piece may be fixed to each of the four corners of the top plate 41 by means of welding or by a rivet or even adhesive. In addition, similar to the first elastic piece 42, an elastic force of the second elastic piece 44 may be adjusted by adjusting a depth at which the top plate screw 43 is screwed into the fixing frame 11, thereby in turn adjusting the pressure acting on the corner region 23 of the electronic device 20.

In addition, as shown in FIG. 7, the second elastic piece 44 has a fixing end fixed to the top plate 41 and a free end opposite to the fixing end. That is to say, one end of the second elastic piece 44 is not fixed to the top plate 41, thereby allowing the second elastic piece to stretch and deform. The second clastic piece 44 may be made of a highly elastic metal material, such as a highly elastic copper alloy, but the present application is not limited to this.

In the illustrated embodiments, the electronic apparatus further includes a side socket connector 32 (as shown in FIG. 5), which is adapted to be positioned at the edge of the electronic device 20 on a side of the electronic device away from the main circuit board 10. That is to say, the side socket connector 32 is positioned at the edge portion of the top surface of the electronic device 20. Therefore, the electrical connection may be established between the side circuit board 30 and the electronic device 20 via the side socket connector 32. The side socket connector 32 may have a substrate made of an insulation material, and a plurality of conductors having elasticity which are positioned within the substrate and penetrate the substrate. The conductors are adapted to be electrically connected with the corresponding pins of the side circuit board 30 and the electronic device 20 positioned on both sides of the side socket connector to establish the electrical connection.

In the embodiment illustrated in FIGS. 1-12, the electronic apparatus may further include the central pressure applying unit 50 which is adapted to apply pressure to the central region 21 and the corner regions 23 of the electronic device 20 to maintain the electrical connection between the main circuit board 10 and the electronic device 20.

As shown in FIGS. 8-12, the central pressure applying unit 50 may include an exerting-pressure member 51, an elastic plate 52, and a connecting member 53. The exerting-pressure member 51 may be positioned to at least partially contact and press the central region 21 and the corner regions 23 of the electronic device 20. The elastic plate 52 may be positioned on a side of the main circuit board 10 opposite to the exerting-pressure member 51. The connecting member 53 may be connected between the exerting-pressure member 51 and the elastic plate 52 to cause the elastic plate to be deformed to generate an elastic force, which is transmitted to the exerting-pressure member 51 via the connecting member 53 to cause the exerting-pressure member 51 to press the electronic device 20.

As shown in FIGS. 8-12, the exerting-pressure member 51 may include a ring portion 511, which has a quadrilateral shape and has an opening in the center thereof, so that the chip in the center of the electronic device 20 may be exposed via the opening for the heat dissipation. The ring portion 511 may at least partially contact and press the central region 21 of the electronic device. The exerting-pressure member 51 may further include a plurality of epitaxial portions 512, each of which extends outward from a corner of the ring portion 511 in a plane in which the ring portion is located. That is to say, the epitaxial portion extends outward at the corner of an outside of the quadrilateral ring portion 511. The epitaxial portion 512 is adapted to at least partially contact and press the corner region 23 of the electronic device.

In the illustrated embodiment, each of the epitaxial portions 512 is positioned at the corner between two adjacent side circuit boards of the side circuit boards 30, and is adapted to make in direct contact with the second elastic piece 44 of the pressure applying unit 40 and pressed by the second elastic piece 44 of the pressure applying unit 40. In this case, the elastic force generated by the deformation of the second elastic piece 44 first acts on the epitaxial portion 512 of the exerting-pressure member 51, and then is transmitted to the corner region 23 of the electronic device. Therefore, not only the exerting-pressure member 51 of the central pressure applying unit 50 applies pressure to the corner regions of the electronic device 20, but also the second elastic piece 44 of the pressure applying unit 40 applies pressure to the corner regions of the electronic device 20, thereby further ensuring the electrical connection between the electronic device 20 and the main circuit board 10.

Still referring to FIGS. 8-12, the central pressure applying unit 50 may further include a nut 54, which is positioned in the middle position of the elastic plate 52. The connection member 53 may have a threaded end 531 and a head 532 opposite to each other, wherein the head 532 is connected to the exerting-pressure member 51, and the threaded end 531 is adapted to be threadedly connected with the nut 54, so that the elastic plate 52 generates an elastic force in a state of elastic deformation when the nut is tightened with the threaded end. The elastic force may be transmitted to the exerting-pressure member 51 via the connection member 53 to cause the exerting-pressure member to press the electronic device 20.

As shown in FIGS. 9-12, the elastic plate 52 may include a body section 521 having elasticity, fixing portions 523, and a connection portion 522. The nut 54 may be fixed in a central region of the body section 521. The fixing portions 523 may be positioned at opposite ends of the body section 521 in a length direction of the body section, and are adapted to being fixedly positioned relative to the main circuit board 10. The connecting portion 522 may be bent and extends between the body section 521 and the fixing portion 523, so that the fixing portion 523 is farther away from the main circuit board 10 than the body section 521.

In addition, the body section 521 is configured to generate an elastic force in a state of elastic deformation when the threaded end 531 of the connection member 53 is tightened with the nut 54. Therefore, by adjusting the tightening degree between the nut 54 and the threaded end 531 of the connection member 53, a magnitude of the elastic force generated by the elastic plate 52 may be adjusted. As a result, a magnitude of the pressure applied by the central pressure applying unit 50 to the central region and the corner regions of the electronic device 20 is adjusted.

As shown in FIGS. 1, 3, 10 and 11, the central pressure applying unit 50 may further include a supporting plate 55, which supports the main circuit board 10 on a side of the main circuit board opposite to the exerting-pressure member 51, thereby preventing deformation of the main circuit board 10. In addition, two opposite ends of the elastic plate 52 of the central pressure applying unit 50 are fixed to the supporting plate 55 by a fastening device 56. As better shown in FIG. 10, the fastening device 56 may include a fixing member 561 and a screw 562, the fixing member 561 being adapted to be fixedly engage with the supporting plate 55, and the screw 562 being adapted to pass through the fixing portion 523 of the elastic plate 52 so as to be threadedly connected with the fixing member 561. By means of the fixing member 561, the fixing portion 523 of the elastic plate 52 is farther away from the main circuit board 10 than the body section 521, so that the elastic plate 52 is able to deform to generate an elastic force.

In the illustrated embodiment, the supporting plate 55 may be fixedly connected to the fixing frame 11 by a bolt passing through the main circuit board 10, so that the main circuit board 10 is sandwiched between the supporting plate 55 and the fixing frame 11, thereby further preventing the deformation of the main circuit board 10.

In some embodiments, as shown in FIGS. 2-5, the electronic apparatus may further include a main socket connector 12, which is positioned between the main circuit board 10 and the electronic device 20, so that the electrical connection is established between the main circuit board 10 and the electronic device 20 via the main socket connector 12. In embodiments including the side socket connector 32, the side socket connector 32 and the main socket connector 12 are positioned on opposite sides of the electronic device 20, respectively.

The main socket connector 12 may have a substrate made of an insulation material, and a plurality of conductors having elasticity which are positioned within the substrate and penetrate the substrate, the conductors being adapted to be electrically connected with the corresponding pins of the main circuit board 10 and the electronic device 20 positioned on both sides of the main socket connector to establish the electrical connection.

In addition, as shown in FIG. 4, the fixing frame 11 fixed to the main circuit board 10 may encircle or surround the main socket connector 12, thereby preventing the main socket connector 12 and the electronic device 20 from displacing in a plane in which the upper surface of the main circuit board 10 is located.

FIGS. 13-21 show another embodiment according to the present application, where the structure, function, and relative position of the main circuit board, the electronic device, the side circuit board, the main socket connector, the side socket connector, and the fixing frame of the electronic apparatus are substantially the same as those of the main circuit board 10, the electronic device 20, the side circuit board 30, the main socket connector 12, the side socket connector 32, and the fixing frame 11 of the electronic apparatus shown in FIGS. 1-12, and thus the same reference numerals are used for representation, and their description will not be repeated.

The embodiment shown in FIGS. 13-21 differs from the embodiment shown in FIGS. 1-12 mainly in that the pressure applying unit 40 positioned on the side of the electronic device 20 and the side circuit boards 30 away from the main circuit board 10 may further apply pressure to the central region 21 of the electronic device 20 to maintain the electrical connection between the main circuit board 10 and the electronic device 20. Therefore, in the embodiment shown in FIGS. 13 to 21, the central pressure applying unit 50 may be omitted, thereby further reducing a space occupied by the electronic device and being able to avoid a drilling hole for the connection member 53 of the central pressure applying unit 50 in the main circuit board 10.

Figure 20:
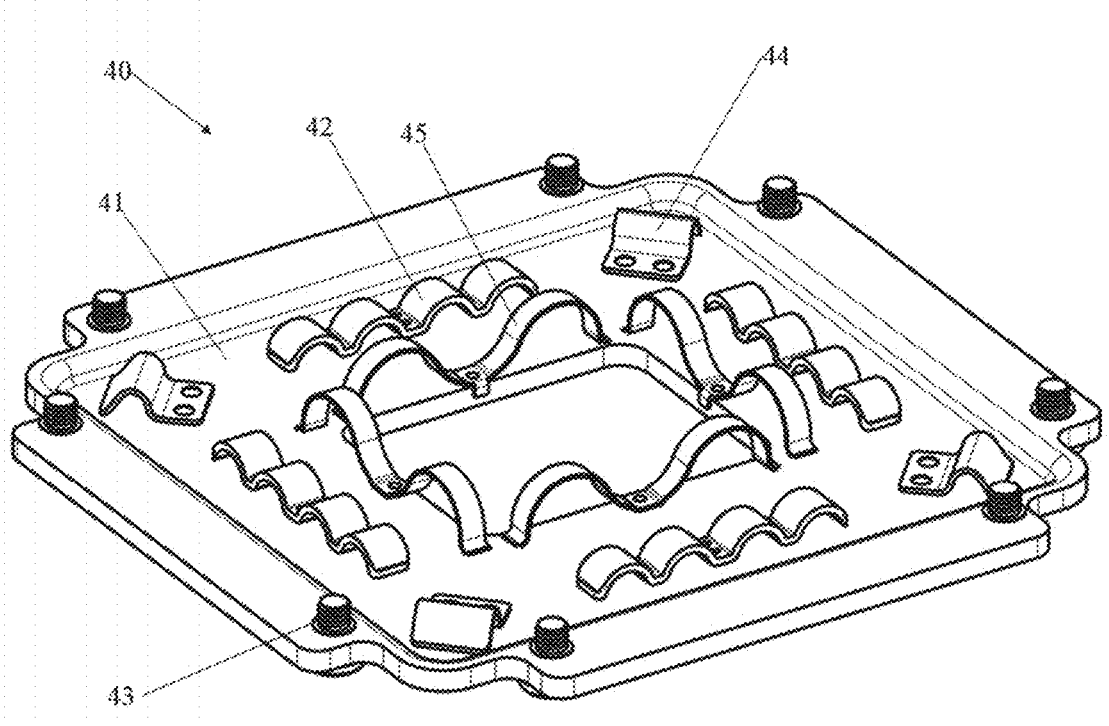
FIG. 20 shows a bottom perspective view of the pressure applying unit of the electronic apparatus according to another embodiment of the present disclosure.
Figure 21:
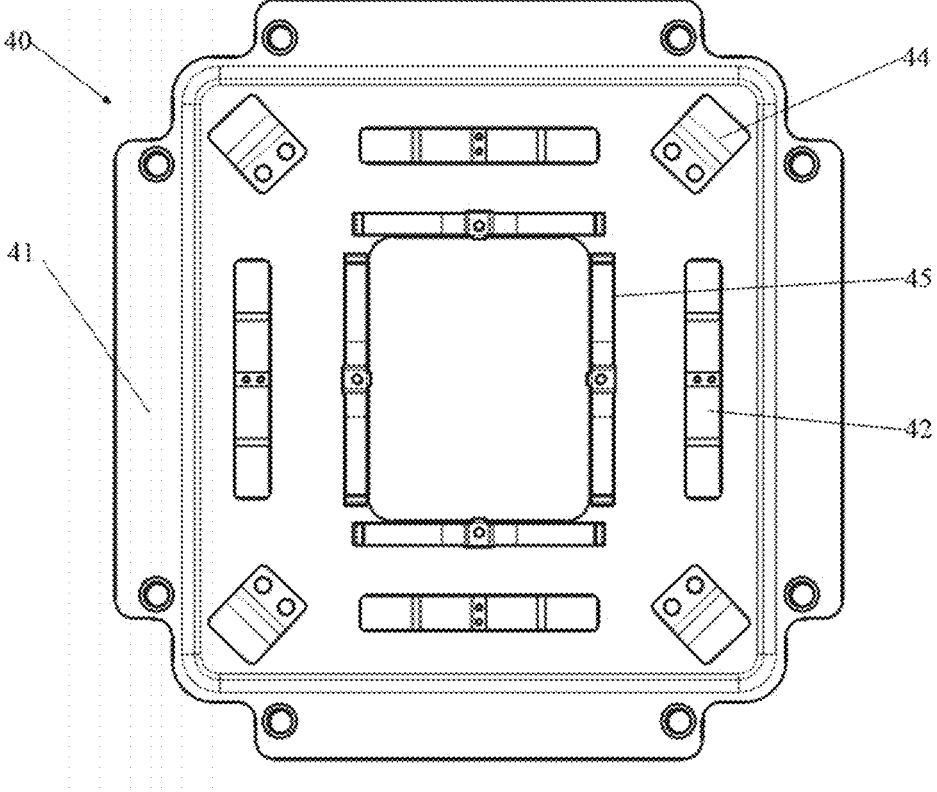
FIG. 21 shows a top view of the pressure applying unit shown in FIG. 20.

As shown in FIGS. 20 and 21, the pressure applying unit 40 may further include a plurality of third elastic pieces 45 adapted to apply pressure to the central region 21 of the electronic device 20, thereby maintaining the electrical connection between the main circuit board 10 and the electronic device 20.

The third elastic piece 45 may be positioned on the side surface of the top plate 41 facing the electronic device 20, that is to say, on the lower surface of the top plate 41. As shown in FIGS. 20 and 21, the third elastic piece 45 is arranged in parallel with the first elastic piece 42, and is closer to the opening for the heat dissipation than the first elastic piece 42. Therefore, the third elastic piece 45 may apply pressure to the central region 21 of the electronic device 20.

Figure 16:
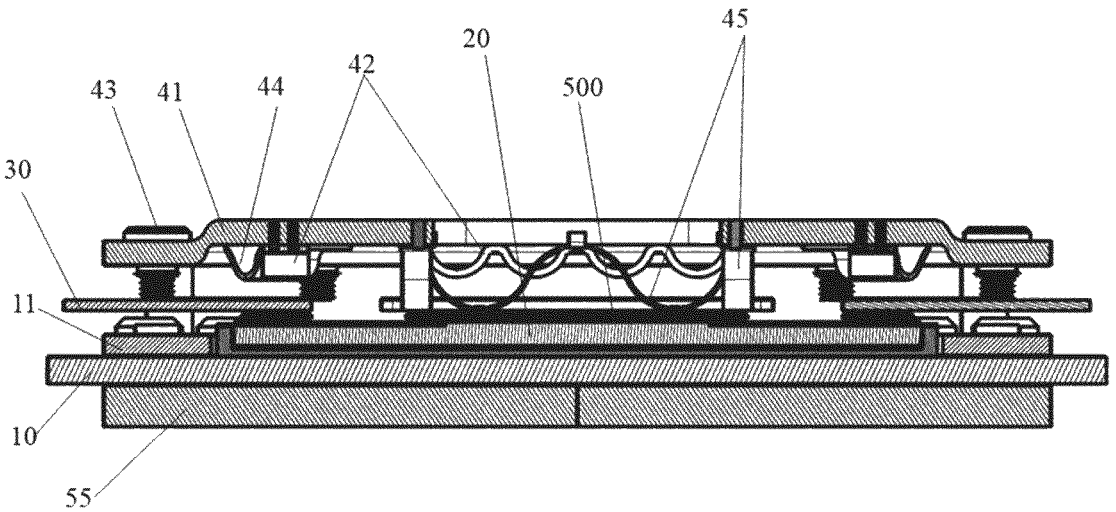
FIG. 16 shows a cross-sectional view of the electronic apparatus according to another embodiment of the present disclosure, in which the cross section passes through the electronic device.
Figure 19:
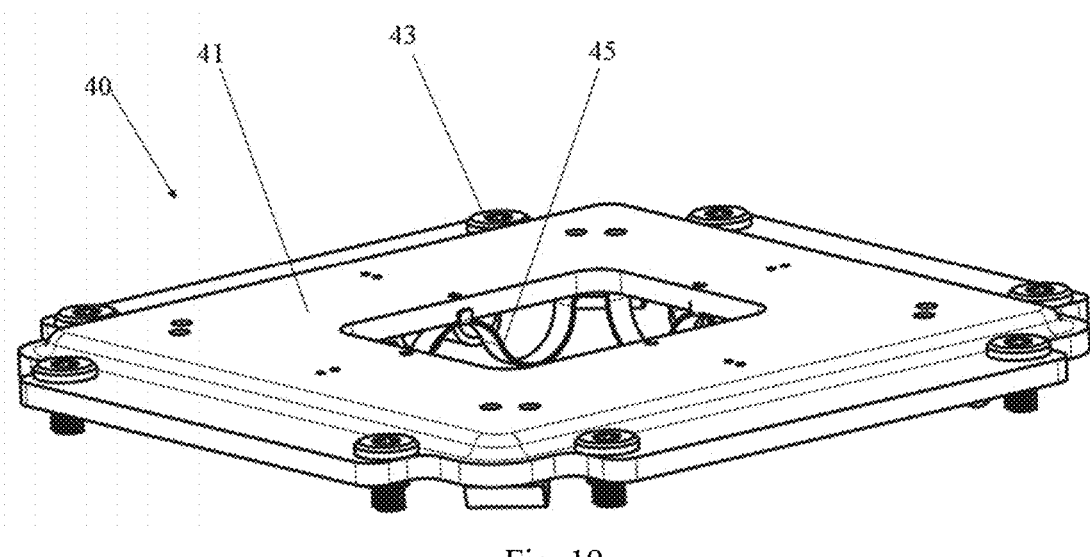
FIG. 19 shows a top perspective view of the pressure applying unit of the electronic apparatus according to another embodiment of the present disclosure.

As shown in FIGS. 19 and 20, the third elastic piece 45 is in a form of wavy, and each third elastic piece 45 has a plurality of protrusions facing the electronic device 20, the protrusions being adapted to apply pressure to the electronic device 20 by deformation. As shown in FIGS. 16 and 20, a height at which the third elastic piece 45 protrudes from the side surface of the top plate 41 may be greater than a height at which the first elastic piece 42 protrudes from the side surface of the top plate 41. In other words, the protruding height of the protrusions of the third elastic piece 45 is greater than that of the protrusions of the first elastic piece 42, thereby applying pressure to the central region 21 of the electronic device 20.

In some embodiments, the third elastic piece 45 is detachably fixed to each of the four sides of the top plate 41. For example, the third elastic piece 45 may be detachably fixed to the top plate 41 by a screw. In other embodiments, the third elastic piece 45 may be fixed to each of the four sides of the top plate 41 by means of welding or by a rivet. Even in some embodiments, the third elastic piece 45 may be bonded to the lower surface of the top plate 41 by adhesive.

As shown in FIGS. 20 and 21, the third elastic piece 45 is fixed to the top plate 41 in the middle position thereof, and two ends of the third elastic piece 45 in a length direction are free ends that are not fixed to the top plate. Therefore, the third elastic piece may stretch and deform in the length direction. Similar to the first elastic piece 42 and the second elastic piece 44, the third elastic piece 45 may be made of a highly elastic metal material, such as a highly elastic copper alloy, but the present disclosure is not limited to this.

In addition, similar to the first elastic piece 42 and the second elastic piece 44, an elastic force of the third elastic piece 45 may be adjusted by adjusting a depth at which the top plate screw 43 is screwed into the fixing frame 11, thereby in turn adjusting the pressure acting on the central region 21 of the electronic device 20.

In some embodiments, the electronic apparatus may further include a second protection plate 500 positioned between the electronic device 20 and the third elastic piece 45. The second protection plate 500 is positioned to cover at least a portion of the central region 21 of the electronic device 20, for example, cover a periphery portion of the central region 21, and expose a central portion of the central region 21, so that heat may be dissipated through the opening of the top plate 41.

The second protection plate 500 may be made of a rigid material and may evenly dispense the pressure applied by the third elastic piece 45 onto the electronic device 20, thereby protecting the electronic device 20 from damage due to concentrated pressure.

In this case, an elastic force generated by the compression of the third elastic piece 45 first acts on a pressed region of the second protection plate 500, then is transmitted to the electronic device 20 positioned below the second protection plate 500, then to the main socket connector 12, and finally to the main circuit board 10.

Similar to the first protection plate 31, the second protection plate 500 may be made of a metal material such as stainless steel, aluminum or aluminum alloy, copper or copper alloy, and a side surface of the second protection plate 500 facing the electronic device 20 is provided with an insulation layer. The insulation layer may be made of plastic and bonded to the lower surface of the second protection plate 500. In some other embodiments, the second protection plate 500 may also be made of a rigid plastic material. Therefore, it is not necessary to provide the insulation layer on the side surface of the second protection plate 500 facing the electronic device.

Figure 17:
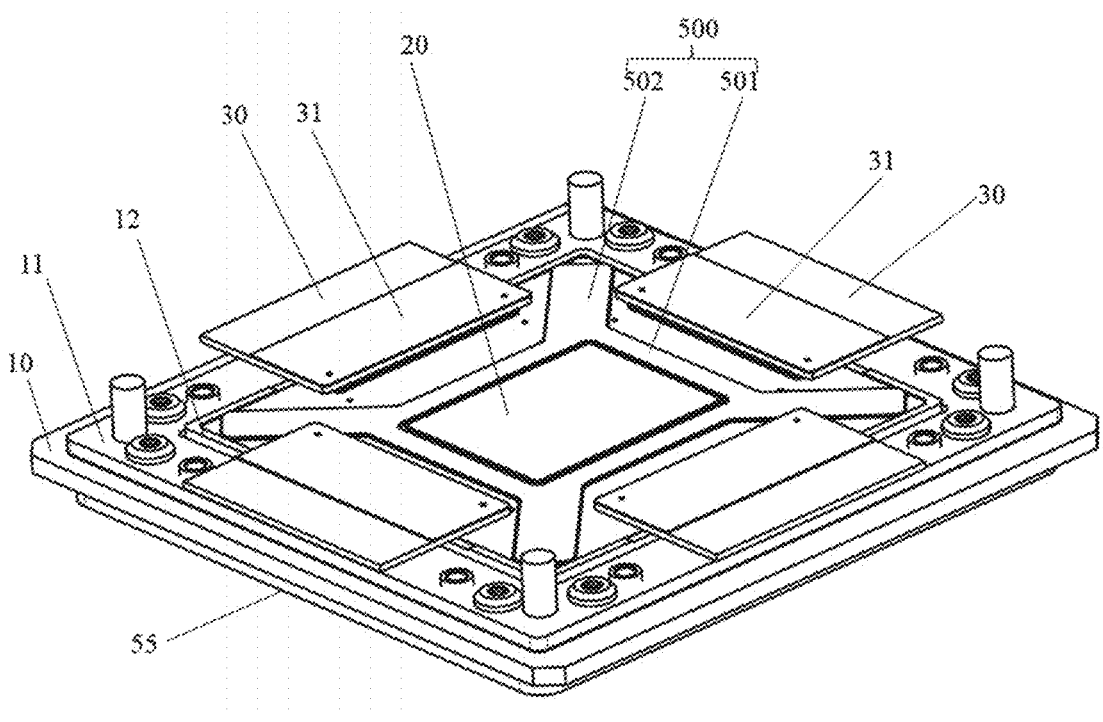
FIG. 17 shows a perspective view of the electronic apparatus with the pressure applying unit removed, according to another embodiment of the present disclosure.
Figure 18:
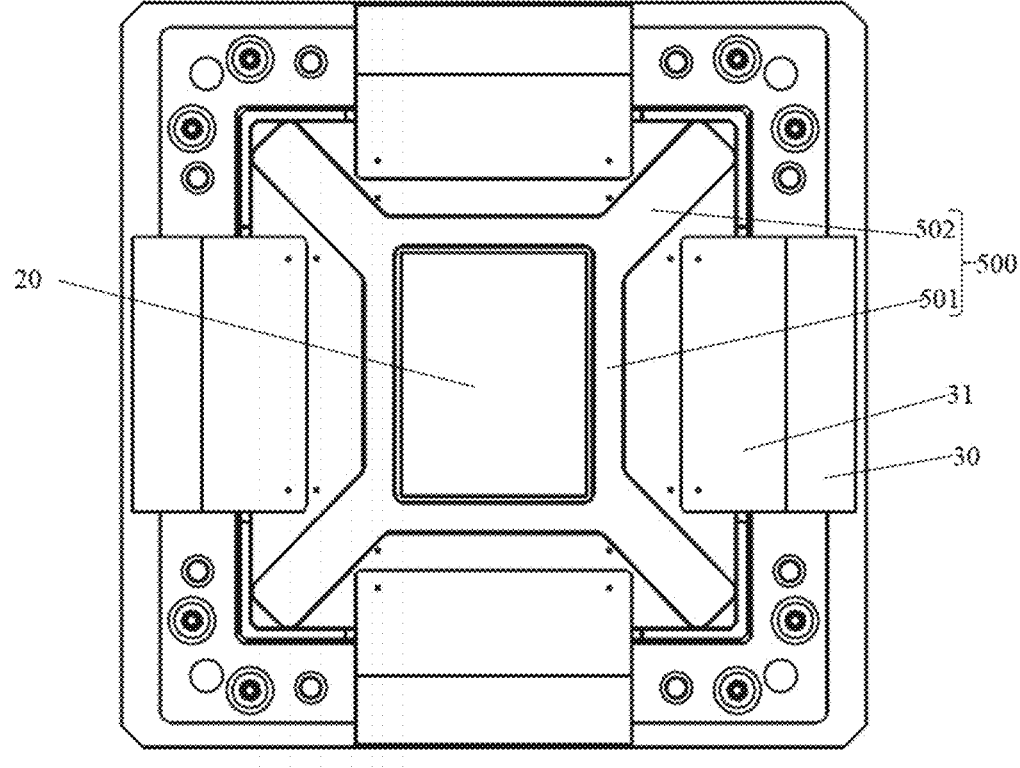
FIG. 18 shows a top view of the electronic apparatus with the pressure applying unit removed shown in FIG. 17.

As shown in FIGS. 17 and 18, the second protection plate 500 may include a central protection portion 501, which may have a quadrilateral shape and have an opening in the center thereof, that is to say, it has a shape similar to a ring. The central protection portion 501 is adapted to evenly disperse the pressure applied by the third elastic piece 45 onto the central protection portion, so that the central protection portion at least partially contact and press the central region 21 of the electronic device.

In addition, the second protection plate 500 may further include a plurality of corner protection portions 502, each of which extends outward from a corner of the central protection portion 501 in a plane in which the central protection portion is located. That is to say, the corner protection portion 502 extends outward at the corner of an outer side of the central protection portion 501 that is quadrilateral. Each of the corner protection parts 502 may be configured to be positioned at the corner between two adjacent side circuit boards of the side circuit boards 30. The corner protection portion 502 is adapted to evenly disperse the pressure applied by the second elastic piece 44 onto the corner protection portion, so that the corner protection portion at least partially contact and press the corner region 23 of the electronic device 20.

Figure 14:
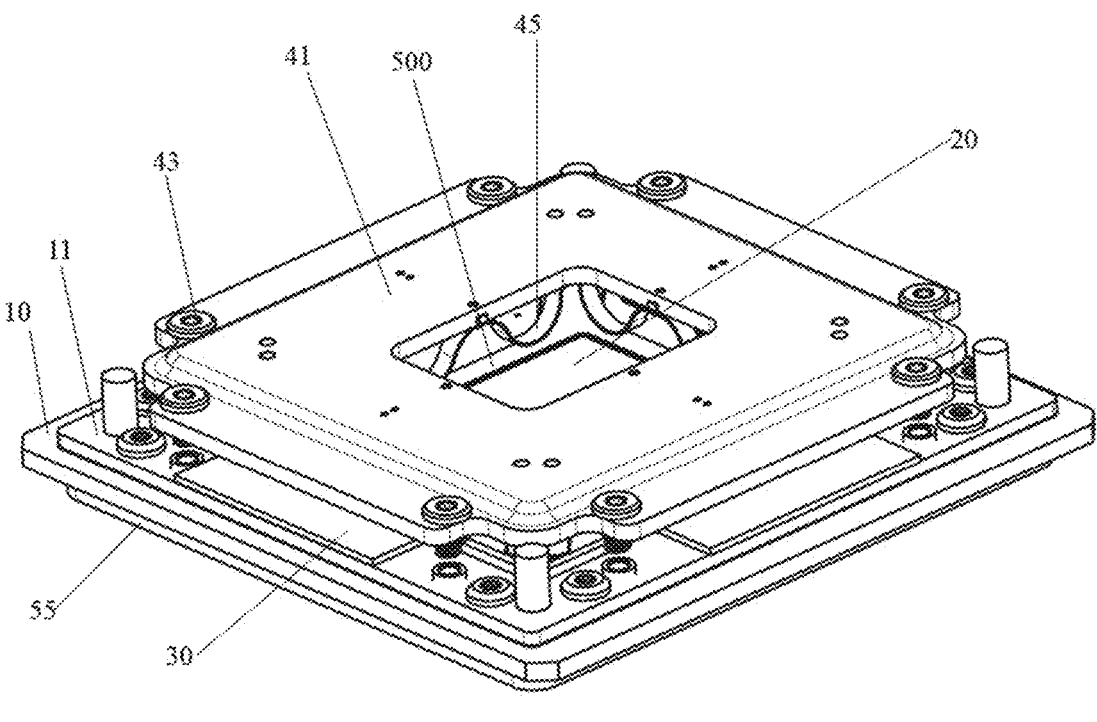
FIG. 14 shows a top perspective view of the electronic apparatus according to another embodiment of the present disclosure.
Figure 15:
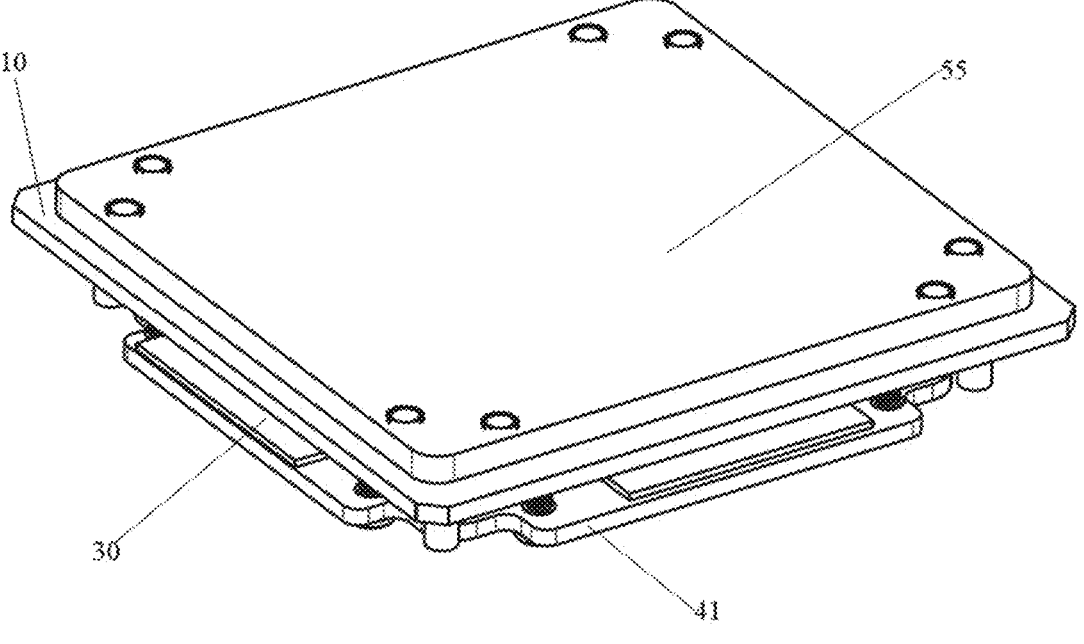
FIG. 15 shows a bottom perspective view of the electronic apparatus according to another embodiment of the present disclosure.

In some embodiments, as shown in FIGS. 14 and 15, the electronic apparatus may further include a supporting plate 55, which supports the main circuit board 10 on a side of the main circuit board opposite to the top plate 41. The supporting plate 55 may be fixedly connected to the fixing frame 11 by a bolt passing through the main circuit board 10, so that the main circuit board 10 is sandwiched between the supporting plate 55 and the fixing frame 11, thereby further preventing the deformation of the main circuit board 10.

Compared with the embodiments shown in FIGS. 1-12, the supporting plate 55 of the electronic apparatus in this embodiment does not need to be connected with the fastening device 56 of the central pressure applying unit 50, thereby reducing a space occupied by the fastening device 56 and the elastic plate 52 of the central pressure applying unit 50. In addition, compared with the embodiment shown in FIGS. 1-12, the electronic apparatus of this embodiment may further avoid a drilling hole for the connection member 53 of the central pressure applying unit 50 in the main circuit board 10, thereby avoiding adverse effects on a circuit layout of the main circuit board 10. In the electronic apparatuses provided by the various embodiments of the present application, the pressure applying unit not only press the side circuit boards onto the electronic device to establish the stable electrical connection between the side circuit boards and the electronic device, but also apply pressure to the side regions and/or the corner regions of the electronic device to establish the stable electrical connection between the main circuit board and the electronic device. In some embodiments, the pressure applying unit may further apply pressure to the central region of the electronic device to establish the stable electrical connection between the main circuit board and the electronic device. In addition, the electronic apparatus of the present application may further include the central pressure applying unit which presses directly the central region and/or the corner regions of the electronic device, thereby further establishing the stable electrical connection between the main circuit board and the electronic device.

Those skilled in the art would understand that the embodiments described above are all exemplary, and those skilled in the art may improve them, and the structures described in the various embodiments may be combined optionally unless they conflict in terms of structure or principle.

Although some embodiments of the present general inventive concept have been illustrated and described, those skilled in the art would understand that modification may be made to these embodiments without departing from the principles and spirit of the present general inventive concept. The scope of the present utility model is defined by the claims and their equivalents.

What is claimed is:

1. An electronic apparatus, comprising:
a main circuit board;
an electronic device installed on and electrically connected to the main circuit board;
side circuit boards positioned at edges of the electronic device on a side of the electronic device away from the main circuit board and electrically connected to the electronic device; and
a pressure applying unit positioned on a side of the electronic device and on each of the side circuit boards away from the main circuit board, the pressure applying unit applying pressure to the side circuit boards to maintain an electrical connection between the side circuit boards and the electronic device, and applying pressure to side regions of the electronic device to maintain an electrical connection between the main circuit board and the electronic device.

2. The electronic apparatus according to claim 1, wherein the pressure applying unit comprises:
a top plate having an opening for heat dissipation of the electronic device in the center of the top plate, and adapted to be directly or indirectly connected to the main circuit board; and
a first elastic piece positioned on a side surface of the top plate facing the side circuit boards and adapted to apply pressure to the side circuit board, wherein the applied pressure acts on the side regions of the electronic device via the side circuit boards.

3. The electronic apparatus according to claim 2, further comprising a fixing frame fixed to the main circuit board, the fixing frame positioned on the same side of the main circuit board as the electronic device and surrounding the electronic device, wherein the top plate is detachably coupled to the fixing frame.

4. The electronic apparatus according to claim 3, wherein the top plate is coupled to the fixing frame by a top plate screw, and an elastic force of the first elastic piece is adjusted by adjusting a depth at which the top plate screw is screwed into the fixing frame.

5. The electronic apparatus according to claim 2, wherein:
the top plate has a quadrilateral shape, and the first elastic piece is detachably fixed to each of four sides of the top plate; or
the first elastic piece is fixed to each of the four sides of the top plate by means of welding or by a rivet.

6. The electronic apparatus according to claim 2, further comprising a rigid first protection plate positioned between the side circuit board and the first elastic piece and dispersing a pressure applied by the first elastic piece onto the side circuit board, the first protection plate including an insulation layer provided on a side surface of the first protection plate facing the side circuit board.

7. The electronic apparatus according to claim 2, wherein the pressure applying unit further comprises a second elastic piece positioned on a side surface of the top plate facing the electronic device and positioned at a corner between two adjacent sides of the top plate, the second elastic piece applying pressure to a corner region of the electronic device.

8. The electronic apparatus according to claim 7, wherein:
the second elastic piece is detachably fixed to each of four corners of the top plate; or
the second elastic piece is fixed to each of the four corners of the top plate by means of welding or by a rivet.

9. The electronic apparatus according to claim 2, wherein the pressure applying unit further comprises a third elastic piece positioned on the side surface of the top plate facing the electronic device and being closer to the opening for the heat dissipation than the first elastic piece, the third elastic piece applying pressure to a central region of the electronic device to maintain the electrical connection between the main circuit board and the electronic device.

10. The electronic apparatus according to claim 9, wherein a height of the third elastic piece protruding from the side surface of the top plate is greater than that of the first elastic piece protruding from the side surface of the top plate.

11. The electronic apparatus according to claim 9, wherein:

the third elastic piece is detachably fixed to each of four sides of the top plate; or the third elastic piece is fixed to each of the four sides of the top plate by means of welding or by a rivet.

12. The electronic apparatus according to claim 9, further comprising a rigid second protection plate positioned between the electronic device and the third elastic piece and dispersing a pressure exerted by the third elastic piece onto the electronic device, the protection plate including an insulation layer on a side surface of the second protection plate facing the electronic device.

13. The electronic apparatus according to claim 12, wherein the second protection plate further comprises:

a central protection portion having a quadrilateral shape and an opening in the center thereof, the central protection portion adapted to evenly disperse the pressure applied by the third elastic piece onto the central protection portion, so that the central protection portion at least partially contacts and presses the central region of the electronic device; and a plurality of corner protection portions each extending outward from a corner of the central protection portion in a plane in which the central protection portion is located, each of the corner protection portions positioned at a corner between two adjacent side circuit boards of the side circuit boards, and being adapted to evenly dispense the pressure applied by the second elastic piece onto the corner protection portion, so that the corner protection portion at least partially contacts and presses the corner region of the electronic device.

14. The electronic apparatus according to claim 3, further comprising a supporting plate supporting the main circuit board on a side of the main circuit board opposite to the top plate, the supporting plate fixedly connected to the fixing frame by a bolt passing through the main circuit board, so that the main circuit board is sandwiched between the supporting plate and the fixing frame.

15. The electronic apparatus according to claim 1, further comprising:

a side socket connector positioned at the edge of the electronic device on the side of the electronic device away from the main circuit board, an electrical connection being established between the side circuit board and the electronic device via the side socket connector; and a main socket connector through which an electrical connection is established between the main circuit board and the electronic device, the side socket connector and the main socket connector positioned on opposite sides of the electronic device.

16. The electronic apparatus according to claim 1, further comprising a central pressure applying unit applying pressure to a central region and corner regions of the electronic device to maintain the electrical connection between the main circuit board and the electronic device, the central pressure applying unit including:

an exerting-pressure member positioned to at least partially contact and press the central region and the corner regions of the electronic device;

an elastic plate positioned on a side of the main circuit board opposite to the exerting-pressure member; and connection member connected between the exerting-pressure member and the elastic plate to cause the elastic plate to be deformed to generate an elastic force, the elastic force being transmitted to the exerting-pressure member via the connection member so that the exerting-pressure member presses the electronic device.

17. The electronic apparatus according to claim 16, wherein the exerting-pressure member comprises:

a ring portion having a quadrilateral shape and having an opening in the center thereof, and at least partially contacting and pressing the central region of the electronic device; and a plurality of epitaxial portions each extending outward from a corner of the ring portion in a plane in which the ring portion is located, and adapted to at least partially contact and press the corner region of the electronic device, each of the epitaxial portions is positioned at the corner between two adjacent side circuit boards of the side circuit boards, and is adapted to be directly contacted with and pressed by the second elastic piece of the pressure applying unit.

18. The electronic apparatus according to claim 17, wherein:

the central pressure applying unit further comprises a nut positioned at an intermediate position of the elastic plate, the connection piece has a threaded end and a head opposite to each other, the head being connected to the exerting-pressure member, and the threaded end being adapted to be threadedly connected with the nut, so that the elastic plate generates an elastic force in a state of elastic deformation when the nut is tightened with the threaded end; and the elastic plate includes:

a body section having elasticity, the nut being fixed in a central region of the body section;

fixing portions positioned at opposite ends of the body section in a length direction, and adapted to be fixedly positioned relative to the main circuit board; and a connection portion being bent and extending between the body section and the fixing portion, so that the fixing portions are farther away from the main circuit board than the body section, the body section generating an elastic force in a state of elastic deformation when the nut is tightened with the threaded end of the connection member.

19. The electronic apparatus according to claim 16, further comprising a supporting plate supporting the main circuit board on a side of the main circuit board opposite to the exerting-pressure member, two opposite ends of the elastic plate being fixed to the supporting plate by a fastening device, the supporting plate fixedly connected to the fixing frame by a bolt passing through the main circuit board, so that the main circuit board is sandwiched between the supporting plate and the fixing frame, wherein the fastening device comprises:

a fixing member fixedly engaging with the supporting plate; and a screw passing through the fixing portion of the elastic plate to be threadedly connected with the fixing member.

20. The electronic apparatus according to claim 1, wherein the electronic device is a central processing unit without a top cover, each of the side circuit boards being positioned at each of edges surrounding a central chip of the central processing unit.

* * * * *